United States Patent
Xi et al.

(10) Patent No.: US 7,969,771 B2
(45) Date of Patent: Jun. 28, 2011

(54) SEMICONDUCTOR DEVICE WITH THERMALLY COUPLED PHASE CHANGE LAYERS

(75) Inventors: Haiwen Xi, Prior Lake, MN (US); Michael Xuefei Tang, Bloomington, MN (US); Yuankai Zheng, Bloomington, MN (US); Patrick Ryan, St. Paul, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 472 days.

(21) Appl. No.: 12/242,620

(22) Filed: Sep. 30, 2008

(65) Prior Publication Data
US 2010/0078620 A1   Apr. 1, 2010

(51) Int. Cl.
*G11C 11/00* (2006.01)

(52) U.S. Cl. .................... 365/163; 365/148; 365/242

(58) Field of Classification Search .................. 365/148, 365/163, 242
See application file for complete search history.

(56) References Cited

U.S. PATENT DOCUMENTS

| | | | |
|---|---|---|---|
| 3,899,407 A | | 8/1975 | Eastwood et al. |
| 4,795,657 A | * | 1/1989 | Formigoni et al. ............. 438/73 |
| 5,789,758 A | * | 8/1998 | Reinberg ............................ 257/3 |
| 6,507,061 B1 | * | 1/2003 | Hudgens et al. ............... 257/295 |
| 7,129,560 B2 | | 10/2006 | Hamann et al. |
| 7,579,611 B2 | * | 8/2009 | Lam et al. .......................... 257/2 |
| 7,718,988 B2 | * | 5/2010 | Lee .................................... 257/2 |
| 7,791,924 B2 | * | 9/2010 | Kim et al. ...................... 365/148 |

OTHER PUBLICATIONS

Mott, "Metal-Insulator Transition," Oct. 1968, Review of Modern Physics, vol. 40, No. 4, pp. 677-683.*

Heckingbottom et al., "Structure of Vanadium Dioxide," May 1962, Nature, 164, pp. 678.*

I. G. Baek, M. S. Lee, S. Seo, M. J. Lee, D. H. Seo, D. -s. Suh, J. C. Park, S. O. Park, H. S. Kim, I. K. Yoo, U-In Chung and J. T. Moon, "High Scalable Non-Volatile Resistive Memory Using Simple Binary Oxide Drive by Asymmetric Unipolar Voltage Pulses," IEDM Tech Dig., p. 587, 2004.

A. Pirovano, A. L. Lacaita, D. Merlani, A. Benvenuti, F. Pellizzer and R. Bez, "Electronic Switching Effect in Phase-Change Memory Cells," IEDM Tech. Dig., p. 923, 2002.

H. Horii, J. H. Yi, J. H. Park, Y. H. Ha, I. G. Baek, S. O. Park, Y. N. Hwang, S. H. Lee, Y. T. Kim, K. H. Lee, U-In Chung and J. T. Moon, "A Novel Cell Technology Using N-Doped GeSbTe Films for Phase Change RAM," Symp. VLSI Tech. Dig., p. 177, 2003.

J. F. De Natale, P. J. Hood and A. B. Harker, "Formation and Characterization of Grain-Oriented VO2 Thin Films," J. Appl. Phys. 66, p. 5844, 1989.

T. Nirschl, J. B. Philipp, T. D. Happ, G. W. Burr, B. Rajendran, M.-H. Lee, A. Schrott, M. Yang, M. Breitwisch, C.-F. Chen, E. Joseph, M. Lamorey, R. Creek, S. H. Chen, S. Zaidi, S. Raoux, Y. C. Chen, Y. Zhu, R. Bergmann, H.-L. Lung and C. Lam, "Write Strategies for 2 and 4-bit Multi-Level Phase Change Memory," IEDM Tech. Dig., p. 461, 2007.

* cited by examiner

*Primary Examiner* — Alexander Sofocleous
(74) *Attorney, Agent, or Firm* — Campbell Nelson Whipps LLC

(57) ABSTRACT

Various embodiments of the present invention are generally directed to an apparatus and method associated with a semiconductor device with thermally coupled phase change layers. The semiconductor device comprises a first phase change layer selectively configurable in a relatively low resistance crystalline phase and a relatively high resistance amorphous phase, and a second phase change layer thermally coupled to the first phase change layer. The second phase change layer is characterized as a metal-insulator transition material. A programming pulse is applied to the semiconductor device from a first electrode layer to a second electrode layer to provide the first phase change layer with a selected resistance.

19 Claims, 6 Drawing Sheets

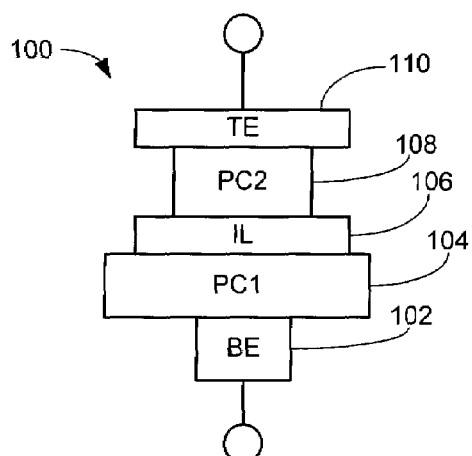
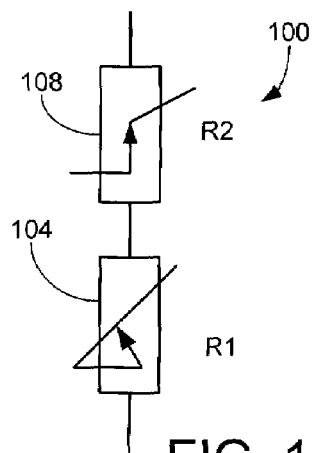
FIG. 1  FIG. 1A
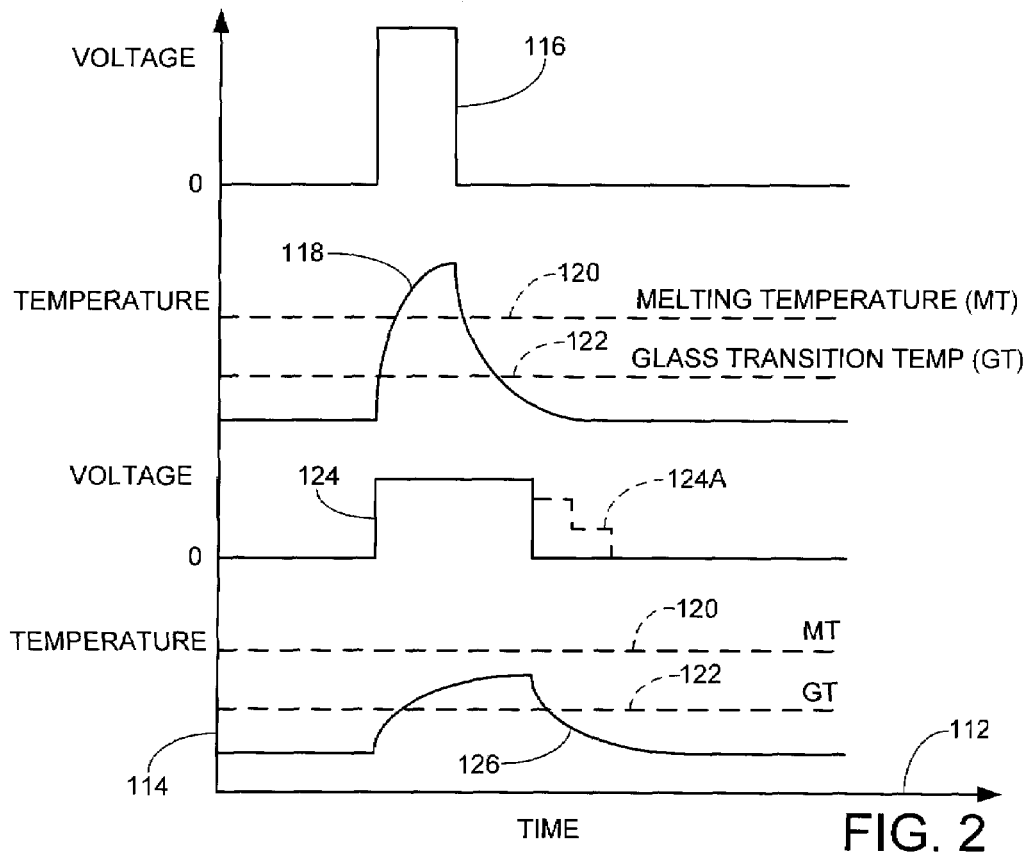
FIG. 2

SEMICONDUCTOR DEVICE WITH THERMALLY COUPLED PHASE CHANGE LAYERS

BACKGROUND

Data storage devices generally operate to store and retrieve data in a fast and efficient manner. Some storage devices utilize a semiconductor array of solid-state memory cells to store individual bits of data. Such memory cells can be volatile or non-volatile. Volatile memory cells generally retain data stored in memory only so long as operational power continues to be supplied to the device. Non-volatile memory cells generally retain data stored in memory even in the absence of the application of operational power.

So-called resistive sense memory (RSM) cells can be configured to have different electrical resistances to store different logical states. The resistance of the cells can be subsequently detected during a read operation by applying a read current and sensing a signal in relation to a voltage drop across the cell.

SUMMARY

Various embodiments of the present invention are generally directed to an apparatus and method associated with a semiconductor device with thermally coupled phase change layers.

In accordance with some embodiments, the apparatus generally comprises a semiconductor device comprising a first phase change layer selectively configurable in a relatively low resistance crystalline phase and a relatively high resistance amorphous phase, and a second phase change layer thermally coupled to the first phase change layer and characterized as a metal-insulator transition material.

In accordance with other embodiments, the method generally comprises providing a semiconductor device comprising a first phase change layer selectively configurable in a relatively low resistance crystalline phase and a relatively high resistance amorphous phase, and a second phase change layer thermally coupled to the first phase change layer and characterized as a metal-insulator transition material; and applying a programming pulse to the semiconductor device to provide the first phase change layer with a selected resistance.

These and various other features and advantages which characterize the various embodiments of the present invention can be understood in view of the following detailed discussion in view of the accompanying drawings.

BRIEF DESCRIPTION OF THE DRAWINGS

FIG. 1 provides an exemplary construction for a semiconductor device in accordance with various embodiments of the present invention.

FIG. 1A is a schematic representation of the device of FIG. 1.

FIG. 2 shows graphical representations of exemplary voltage pulse and temperature curves for a first phase change layer of the device of FIG. 1.

DETAILED DESCRIPTION

Figure 3:
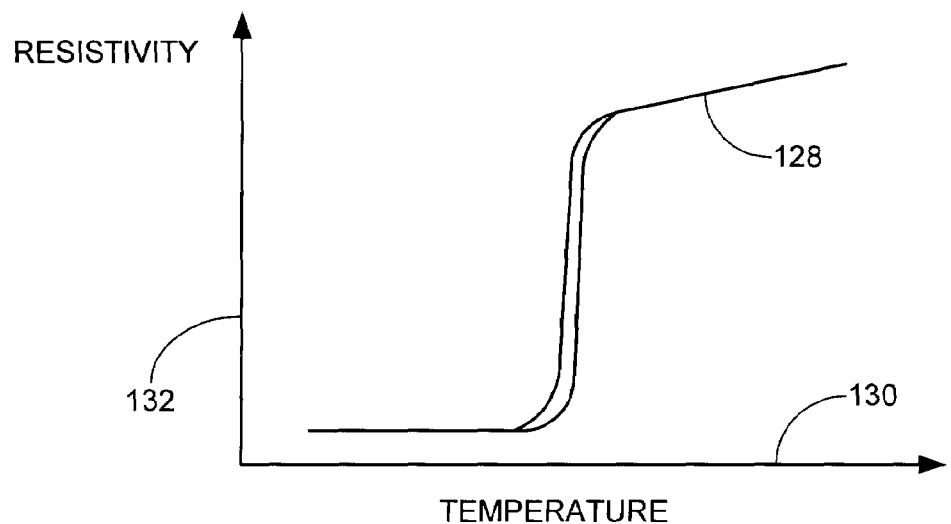
FIG. 3 shows exemplary insulative-metal transition characteristics for a second phase change layer of the device of FIG. 1.

FIG. 1 shows a construction for a thin film semiconductor device 100 in accordance with various embodiments of the present invention. The device includes a bottom electrode (BE) layer 102, a first phase change (PC1) layer 104, an intermediate insulation layer 106, a second phase change (PC2) layer 108, and a top electrode (TE) layer 110. The PC1 and PC2 layers 104, 108 behave as serially arranged programmable resistors (FIG. 1A), with the PC1 layer 104 generally operating as a linear resistive element and the PC2 layer 108 generally operating as a non-linear resistive element. The device 100 can be configured for use in a variety of applications, such as a high current capacity rectifier, a resistive sense memory element in a non-volatile memory array, etc.

The electrode layers 102, 110 are formed of a suitable metallic or similar material to provide high conductivity connections of the device 100 to associated input and output access lines. The intermediate layer 106 is characterized as a thin oxide, metal, or other material which physically isolates the respective PC1 and PC2 layers 104, 108 to provide electrical current path separation without otherwise substantially affecting device operation.

The PC1 layer 104 is formed of a phase change material that transitions between a crystallized phase, at which the layer has a relatively low resistance $R_L$, and an amorphous (glass) phase, at which the layer has a relatively high resistance $R_H$. Suitable materials for the PC1 layer 104 include the chalcogenide of group VI of the periodic table, such as Tellurium (Te) and Selenium (Se). In some embodiments, the PC1 layer 104 is formed of $Ge_2Sb_2Te_5$ (GST). In other embodiments, In—Ge—Te is used.

The PC1 layer 104 transitions between the crystallized and amorphous phases in response to joule heating, such as by passage of a suitable current through the device 100. To place the PC1 layer 104 into the amorphous phase, a relatively high voltage is applied across the device 100 such that the PC1 layer 104 is heated above its melting temperature. The voltage is removed rapidly so as to provide a relatively sharp cooling transition (referred to as a quenching process). In such case, the atoms may not have sufficient time to relax and fully array into a crystalline lattice structure, thereby ending in a metastable amorphous phase with a high resistance.

The PC1 layer 104 is placed into the crystalline phase by applying a voltage pulse of relatively lower and longer duration. The voltage pulse is configured to raise the temperature of the layer so as to be above its glass transition temperature and below its melting temperature, and to gradually decrease in temperature back to ambient level. This will generally provide sufficient dwell time for the material to crystallize (such processing is referred to as a crystallizing or set process).

The respective melting and glass transition temperatures of the PC1 layer 104 will depend on a number of factors including material composition, the dimensions of the layer, processing steps carried out to form the layer, etc. Exemplary values may be on the order of about 400° C. for the melting temperature and about 200° C. for the glass transition temperature.

FIG. 2 shows generalized graphical representations of a number of curves to illustrate the aforedescribed programming operations of the PC1 layer 104. FIG. 2 is plotted against an elapsed time x-axis 112 and a common y-axis 114 to depict both temperature and voltage amplitudes.

Curve 116 in FIG. 2 represents a first voltage pulse that is applied to place the PC1 layer 104 in the amorphous phase (high resistive state). The first voltage pulse has a relatively high amplitude and relatively short duration. With reference again to FIG. 1, the first voltage pulse is applied to the BE layer 102, and the areal contact of the BE layer 102 is localized (reduced) to promote increased current density flowing into the PC1 layer 104.

A corresponding temperature of the PC1 layer 104 is denoted by curve 118 in FIG. 2. The associated melting and glass transition temperatures are represented by dashed lines at 120 and 122, respectively. As shown by curve 118, the first voltage pulse raises the temperature of the PC1 layer 104 above the melting temperature 120, after which the temperature of the layer is quenched by the abrupt trailing edge of the first voltage pulse so that the PC1 layer 104 retains the amorphous phase and associated high resistance.

Curve 124 in FIG. 2 represents a second voltage pulse that is applied to place the PC1 layer 104 in the crystallized phase (low resistive state). The second voltage pulse of curve 124 is both lower in amplitude and longer in duration than the first voltage pulse of curve 116. The corresponding temperature profile of the PC1 layer 104 is denoted by curve 126. The longer dwell time provided by the second voltage pulse allows the material to crystallize and provide the aforementioned low resistance state.

While the second voltage pulse is shown to be a square wave pulse, other pulse forms can be used, such as exemplified by a stepwise trailing edge 124A. Other exemplary pulse forms include, without limitation, sawtooth, sinusoidal, triangular, multifrequency, multi-modal, etc. Tailoring the shape of the second voltage pulse can result in different dwell profiles in the zone between the melting and glass transition temperatures, thereby providing different low resistance values for the crystallized phase of the PC1 layer 104. Pulse forms can be readily derived empirically depending on the desired final resistance characteristics.

The PC2 layer 108 is characterized as an oxide layer with metal-insulator transition (MIT) characteristics. A suitable material for the PC2 layer 108 is vanadium dioxide ($VO_2$), although other MIT materials can be used. $VO_2$ can exhibit a metal-insulator transition at a temperature of around 70° C. At temperatures below the MIT transition temperature, the material acts as an electrically insulative layer with a relatively high resistance. Above the MIT transition temperature, the material acts as an electrically conductive metal with a relatively low resistance. The transition is relatively sharp and the change in resistivity ($\Delta R$) can be on the order of about $10^5$ or more.

Resistivity (resistance per unit area) of $VO_2$ above the MIT temperature can be on the order of about 65 $\mu\Omega/cm^2$. The MIT transition temperature can be tuned including by changes to the oxide composition and changes in the preparation of the material during manufacturing. The current density passing through $VO_2$ to heat it to the transition temperature can be on the order of about 104 $A/cm^2$, or even lower.

FIG. 3 provides a graphical representation of an exemplary resistivity curve 128 for the PC2 layer 108, plotted against a temperature x-axis 130 ($1000/T(K^{-1})$) and a resistivity y-axis 132 (log R ($\Omega$-cm)). Some amount of hysteresis is shown in the MIT transition, but such is on the order of about 10° C. and thus can be generally ignored, as such hysteresis has negligible effect on device operation of the various embodiments presented herein.

Figure 4:
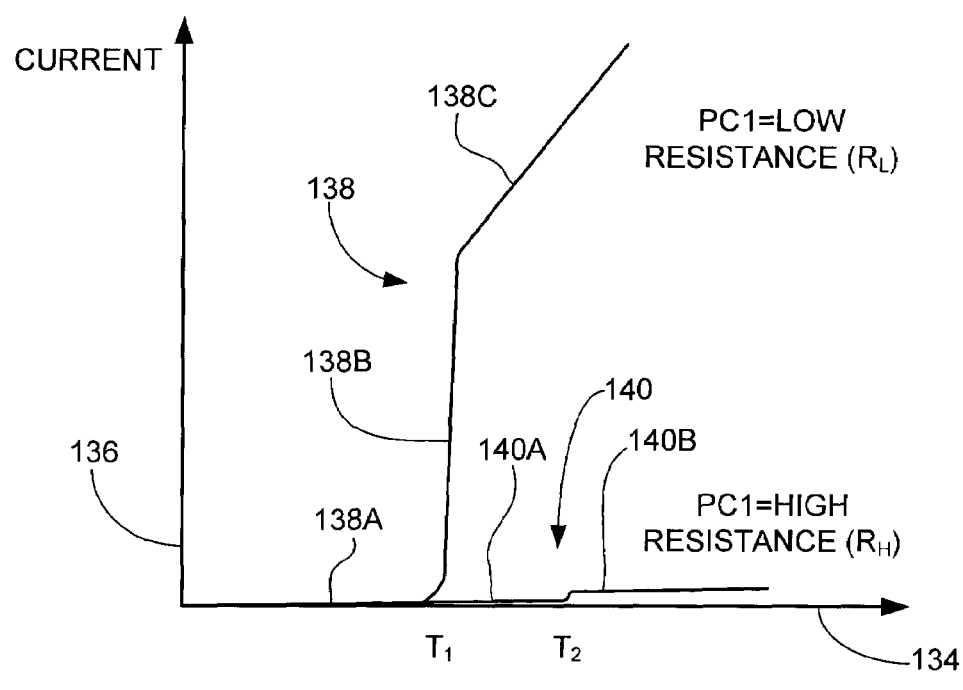
FIG. 4 provides exemplary I-V curves for the device of FIG. 1 in accordance with some embodiments.

FIG. 4 provides a pair of I-V curves plotted against a voltage amplitude x-axis 134 and a current amplitude y-axis 136 to illustrate exemplary operation of the device 100 in the respective PC1 programmed states. Curve 138 depicts output current through the device 100 when the PC1 layer 104 is programmed to a low resistance state (crystallized phase). Because of the initial high resistance of the PC2 layer 108, substantially no current will flow through the device 100 up until a first transition ($T_1$) is reached. This first segment of curve 138 is denoted as 138A. At $T_1$, the PC2 layer 108 transitions from insulator to metal, resulting in a rapid and substantially step-wise increase in current (segment 138B), after which the current through the device increases substantially linearly with respect to voltage (segment 138C). The linear nature of segment 138C is determined by the crystalline phase of the PC1 layer 134.

Curve 140 in FIG. 4 shows current through the device 100 when the PC1 layer 134 is programmed to the high resistance state (amorphous phase). Substantially zero current passes through the device 100 along a first segment 140A while the PC2 layer 108 remains in an insulative state. Generally, because the high resistance state of the PC1 layer 104 takes the major part of the voltage across the device, and because of the thermal coupling between the respective PC1 and PC2 layers, a higher voltage is required before the PC2 layer 108 transitions to the metal state (transition $T_2$). At this point, the PC2 layer 108 becomes conductive, but the PC1 layer 104 remains substantially nonconductive with high resistance. Thus, the remaining portion of curve 140 above the transition T2, segment 140B, continues to exhibit low current flow with continued increases in voltage.

For curve 138 in FIG. 4, the initial current I for segment 138A can generally be expressed as:

$$I = \frac{V}{R_{1L} + R_{2H}} \quad (1)$$

where $R_{1L}$ is the low resistance of the PC1 layer 104 and $R_{2H}$ is the high resistance of the PC2 layer 108 in the initial insulative state. Upon transition of the PC2 layer 108 to the metal state (and associated resistance $R_{2L}$), the current will stepwise increase to $$I = \frac{V}{R_{1L} + R_{2L}} \quad (2)$$

It is noted that generally, $R_{1L} > R_{2L}$, so the linear characteristics of segment 138C in FIG. 4 are primarily a result of the resistance characteristics of the PC1 layer 104.

For the high resistance state of curve 140, initially, segment 140A will provide a current as follows:

$$I = \frac{V}{R_{1H} + R_{2H}} \quad (3)$$

where $R_{1H}$ is the high resistance of the PC1 layer 104. As noted above, the current I will be substantially zero because of the respective high resistances of $R_{1H}$ and $R_{2H}$. After the PC2 layer 108 transitions to the metal phase, the current will be:

$$I = \frac{V}{R_{1H} + R_{2L}} \quad (4)$$

This provides an increase in the amount of current after the $T_2$ transition, but substantially little additional current flows because of the high value for $R_{1H}$.

Figure 5:
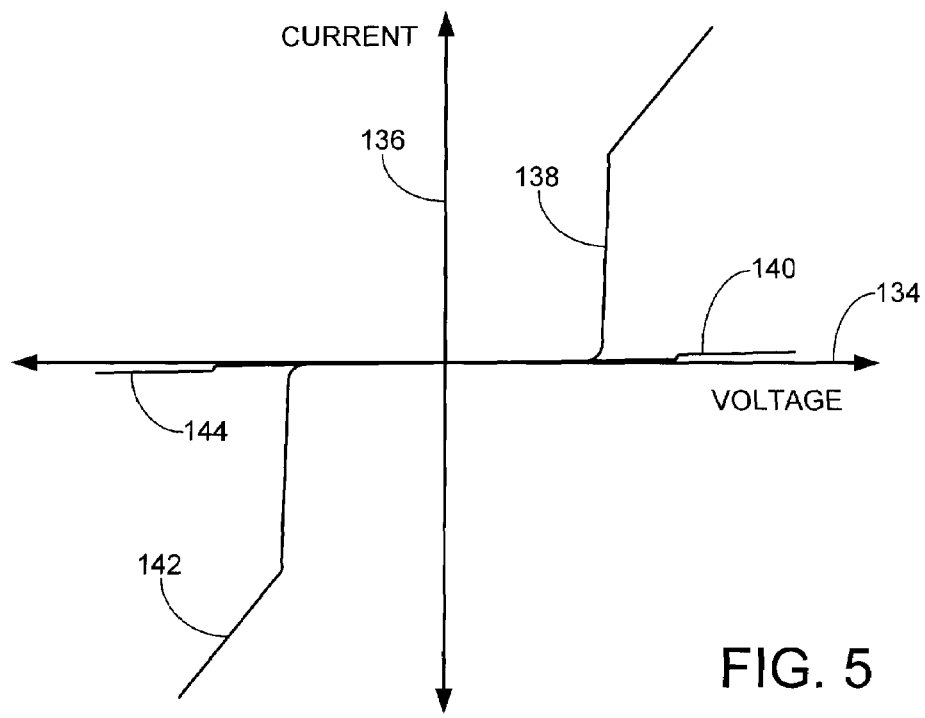
FIG. 5 provides corresponding dual polarity I-V curves for the device.

From FIG. 4 it can be seen that the device 100 can be configured to operate as a very precise, high capacity programmable rectifier. Current densities on the order of about $J=10^5$ A/cm$^2$ or higher can be sustained when the device 100 is programmed to the low resistance state for the PC1 layer 104. FIG. 5 provides the curves 138, 140 of FIG. 4 in conjunction with mirrored curves 142, 144 to demonstrate that the I-V behavior of the device 100 is generally symmetric in both polarity directions.

The device 100 can also be used as a programmable memory cell in a non-volatile semiconductor storage array. With reference again to FIG. 4 a read voltage $V_R$ can be applied to the device 100 at a suitable magnitude above the transition level of the PC2 layer 108, such as $V_R > T_2$. The resistance of the device 100 can be sensed in relation to the magnitude of current that passes through the device (e.g., segment 138C or segment 140B, respectively). In this way, a single bit can be stored in the device 100 in relation to the programmed resistance of the PC1 layer 104. $R_{1H}$ can be used to provide a logical "0" and $R_{1L}$ can be used to provide a logical "1," or vice versa. The high resistance of the device below the threshold T1 advantageously results in low leakage current in a memory array.

Figure 6:
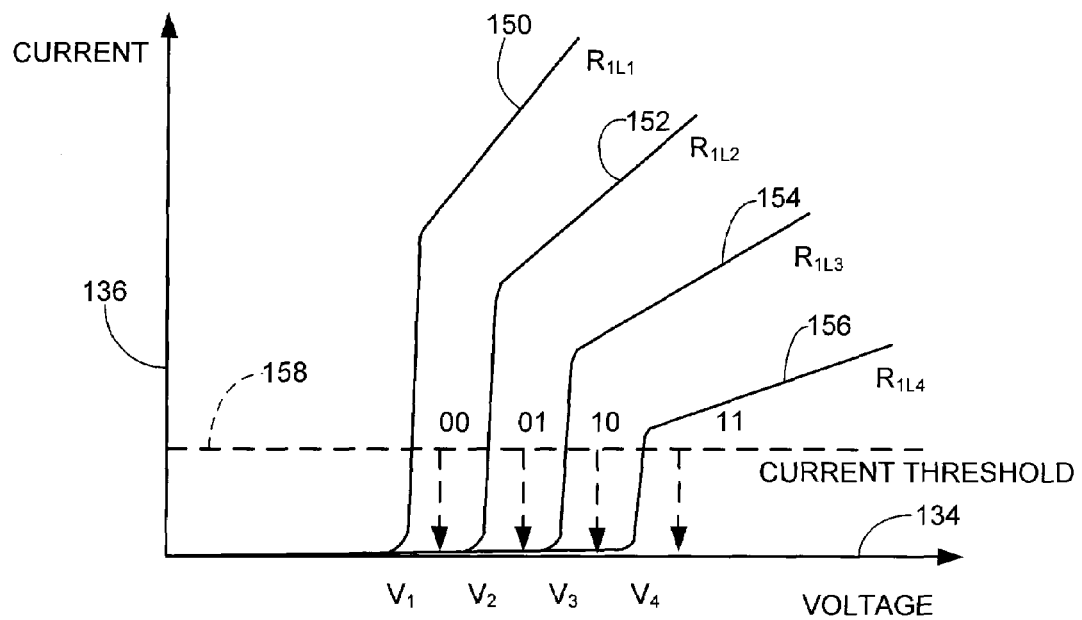
FIG. 6 provides exemplary I-V curves for the device of FIG. 1 in accordance with other embodiments to illustrate a first manner in which a resistance of the device can be read.

The device 100 can be alternatively configured as a multi-bit storage cell in which multiple bits of data are stored in relation to different storage states of the device. FIG. 6 shows four different current response curves 150, 152, 154 and 156 plotted against V-I axes 134, 136. The four curves correspond to four different possible low resistive states of the PC1 layer 104 ($R_{1Lx}$ with $x=1$ to 4) where $R_{1L1} < R_{1L2} < R_{1L3} < R_{1L4}$. These different resistances can be respectively obtained by providing different crystallizing voltage pulses to the PC1 layer 104 (such as 124 in FIG. 2). The appropriate pulse shapes and resulting resistances can be derived empirically. While FIG. shows all four curves 150, 152, 154, 156 together, it will be appreciated that the device 100 is generally only programmed to a single selected one of these respective curves at a given time.

When a voltage is applied to the device 100, the temperature T of the device will be substantially proportional to the power P dissipated by the device, $$P = \frac{V^2}{R_{2H} + R_{1Lx}} \quad (5)$$

Therefore, the transition voltage $V_x$ (where x=1 to 4) at which the PC2 layer 108 transitions from insulative to metal phase will be slightly different for each of the different resistive states of the PC1 layer 104, i.e., $V_1 < V_2 < V_3 < V_4$.

The four possible low resistive states of the PC1 layer 104 can be used to store two bits of data, as set forth by Table 1.

TABLE 1

| Data | Resistance of PC1 Layer |
|---|---|
| 00 | $R_{1L1}$ |
| 01 | $R_{1L2}$ |
| 10 | $R_{1L3}$ |
| 11 | $R_{1L4}$ |

In this example, to store "00" in the device 100, the resistance of the PC1 layer 104 is set to the curve 150 in FIG. 6; to store "10," the resistance of the PC1 layer 104 is set to curve 154 in FIG. 6, and so on. Other numbers of bits can be stored in relation to different selectable resistances of the PC1 layer, as desired. Generally $2^N$ different resistances can be used to store N bits of information.

In some embodiments, the storage state of the device 100 is read by applying a voltage with a value between $V_1$ and $V_2$ to the device. If the output current is higher than a predetermined current threshold 158, the resistance is known to be $R_{1L1}$ and the storage state is 00. If the current is lower than the threshold 158, the read voltage is incremented to a higher value (e.g., between $V_2$ and $V_3$) and the process is repeated until the storage state is identified. Care should be taken to ensure read voltages are not of sufficient nature (high amplitude, short duration, etc.) so as to induce reprogramming of the PC1 layer resistance.

Figure 7:
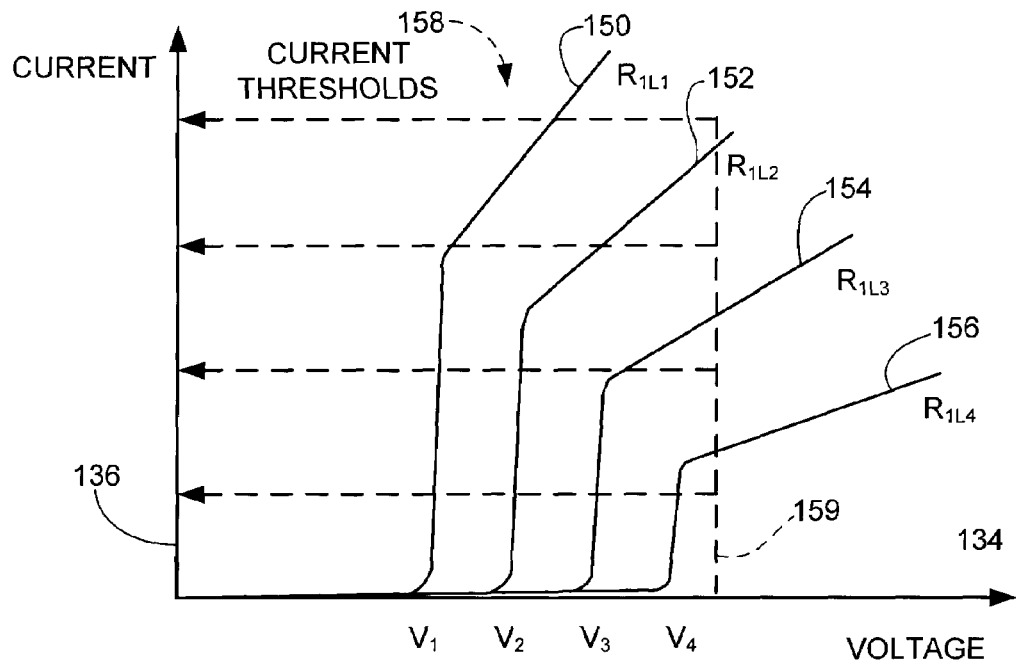
FIG. 7 illustrates an alternative manner in which a resistance of the device can be read.

In other embodiments, the multi-bit storage state of the device 100 can be read in accordance with FIG. 7. In FIG. 7, a read voltage higher than V4 is initially applied (such as shown at dashed line 159) and the state of the cell is determined by discerning the amount of current that flows through the device 100 in relation to respective threshold current values 158. Depending on the sensing structure, a single reading can be taken to identify the storage state, or stepwise reduced voltages can be successively applied as in FIG. 6.

Figure 8:
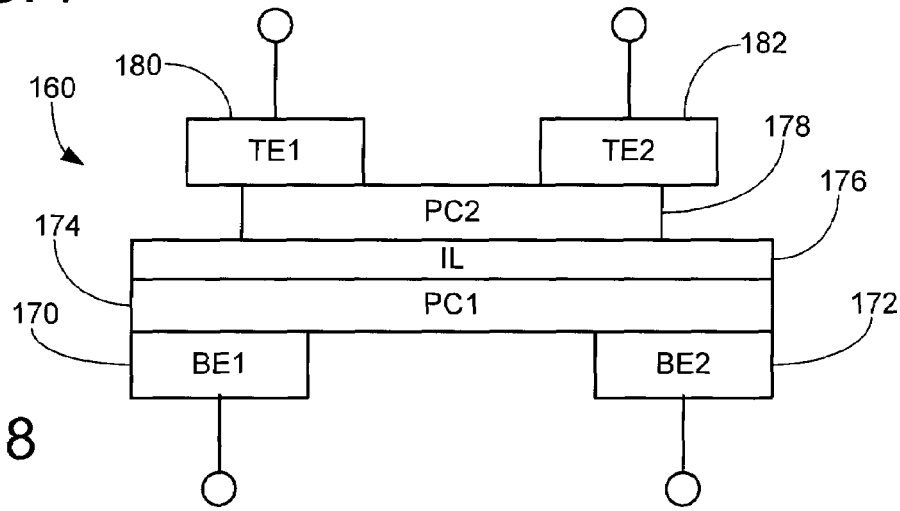
FIG. 8 provides an alternative construction for a semiconductor device generally similar to the device of FIG. 1.
Figure 8A:
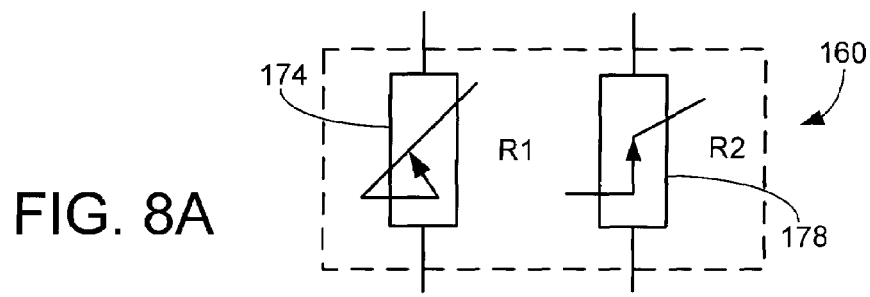
FIG. 8A provides a corresponding schematic representation of the device of FIG. 8.

FIG. 8 shows an alternative construction for a semiconductor device 160 generally similar to the device 100, but which uses different programming and read paths. Bottom electrode layers (BE1 and BE2) 170, 172 are coupled to a first phase change layer (PC1 layer) 174. An intervening layer 176 is disposed between the PC1 layer 174 and a second phase change layer (PC2 layer) 178. Top electrode layers (TE1 and TE2) are denoted at 180 and 182. The PC1 and PC2 layers 174, 178 are substantially identical in construction to the PC1 and PC2 layers 104, 108 of FIG. 1. The respective resistances, however are generally arranged in parallel as represented in FIG. 8A.

In some embodiments, programming of the PC1 layer 174 is carried out through a first path, such as BE1 to TE1, and read operations are carried out through a separate second path, such as BE2 to TE2. Other embodiments can use a different number of top and bottom electrodes. As before, the bottom electrode layers BE1 and BE2 170, 172 have localized areal extents to improve current density through the PC1 layer 174.

The device 160 can also be utilized as a programmable rectifier or memory cell. When used as a memory cell, a single bit or multiple bits can be stored, as desired. The storage of multiple bits using different levels of low resistance for the PC1 layer 174 is generally represented in FIG. 9.

Figure 9:
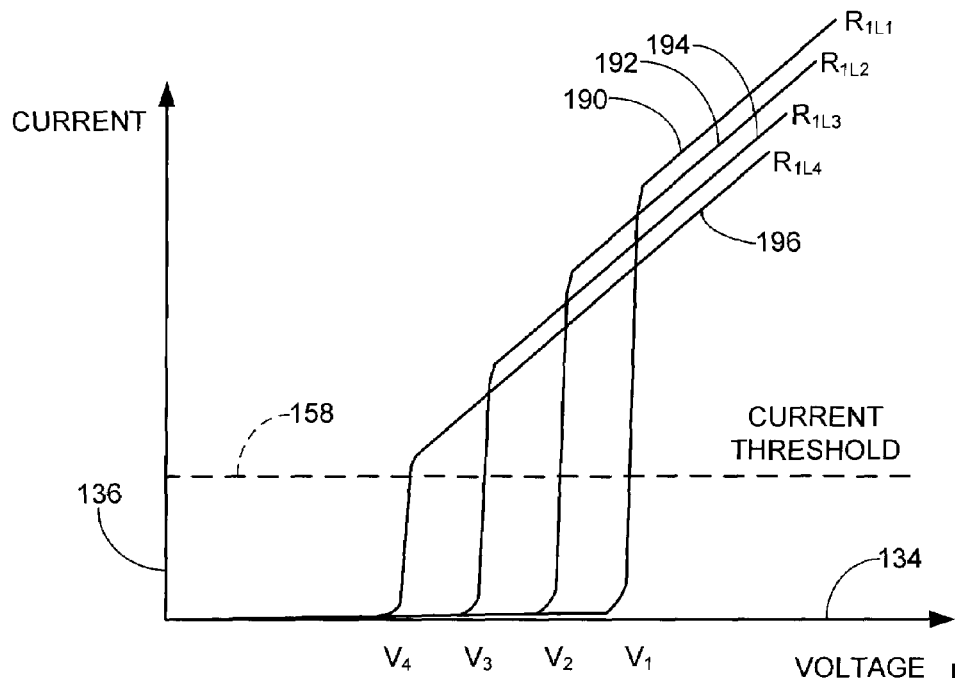
FIG. 9 sets forth exemplary I-V curves for the device of FIG. 8.

The PC1 layer 174 is shown in FIG. 9 to be alternatively programmable to four different resistances R1Lx where x=1 to 4 for curves 190, 192, 194 and 196, respectively (where $R_{1L1}<R_{1L2}<R_{1L3}<R_{1L4}$). The programming pulses are provided through the PC1 layer 174 (i.e., applied to BE1 or BE2 in FIG. 8), whereas the read pulses are provided through the PC2 layer 178 (i.e., applied to TE1 or TE2 in FIG. 8). Because of the thermal coupling between the respective PC1 and PC2 layers 174, 178, different transition voltages $V_1$, $V_2$, $V_3$ and $V_4$ will be provided in relation to the different resistances $R_{1L1}$, $R_{1L2}$, $R_{1L3}$ and $R_{1L4}$ (e.g., the lowest resistance $R_{1L1}$ will provide the highest transition voltage $V_1$, etc.). The respective storage state of the device 160 can be sensed as discussed above.

Figure 10:
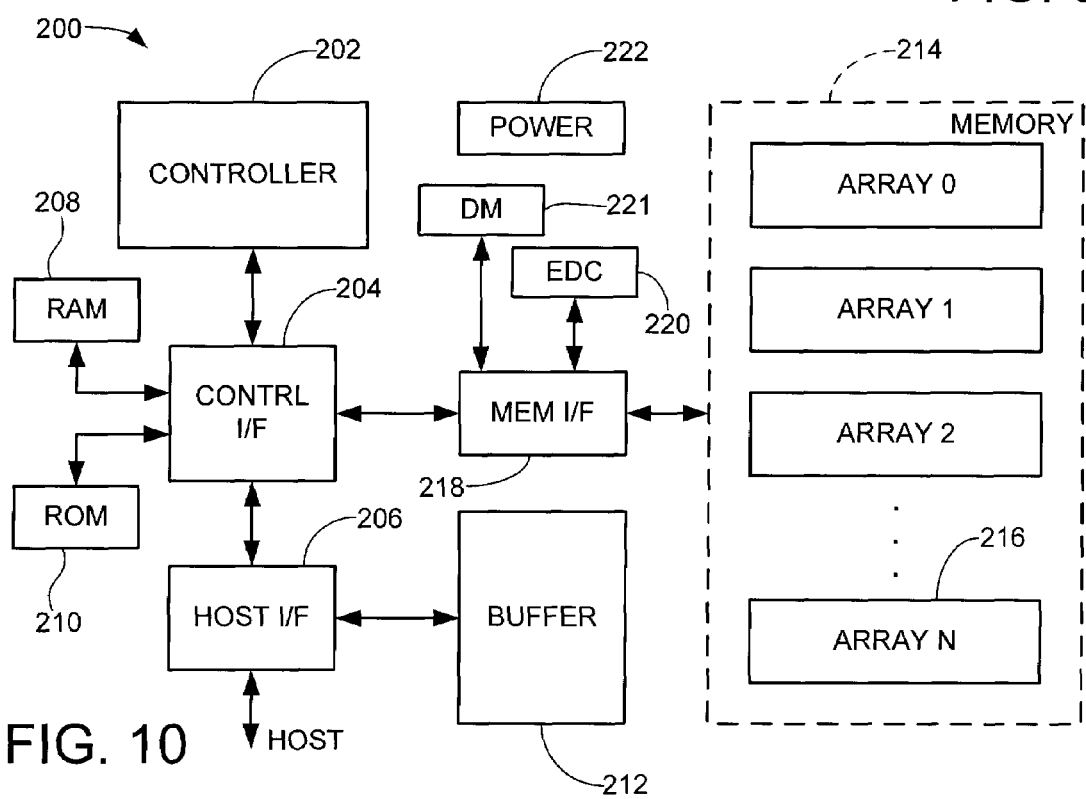
FIG. 10 is a generalized functional representation of an exemplary data storage device which uses the devices of FIG. 1 and/or 8 as non-volatile memory cells.

FIG. 10 provides a functional block representation of an exemplary semiconductor data storage device 200 that can be constructed using the respective devices 100, 160 set forth above. Top level control of the device 200 is carried out by a suitable controller 202, which communicates with a host device via a controller interface (I/F) circuit 204 and a host I/F circuit 206. Local storage of requisite commands, programming, operational data, etc. is provided via random access memory (RAM) 208 and read-only memory (ROM) 210.

A buffer 212 serves to temporarily store input write data from the host device and readback data pending transfer to the host device, as well as to facilitate serialization/deserialization of the data during a transfer operation. The buffer can be located in any suitable location, including in a portion of the array.

A memory space is shown at 214 to comprise a number of memory arrays 216 (denoted Array 0-N), although it will be appreciated that a single array can be utilized as desired. Each array 216 preferably comprises a block of semiconductor memory of selected storage capacity, with individual nonvolatile cells configured as set forth at 100 in FIG. 1 or at 160 in FIG. 8 to provide single or multi-bit data storage. The memory space 214 can include both constructions 100, 160, or other related constructions, in different locations as desired.

Communications between the controller 202 and the memory space 214 are coordinated via a memory (MEM) I/F 218. On-the-fly error detection and correction (EDC) encoding and decoding operations are carried out during data transfers by way of an EDC block 120. Defect management is controlled via DM block 121. Input power to operate the device is handled by a suitable power management circuit 122.

Figure 11:
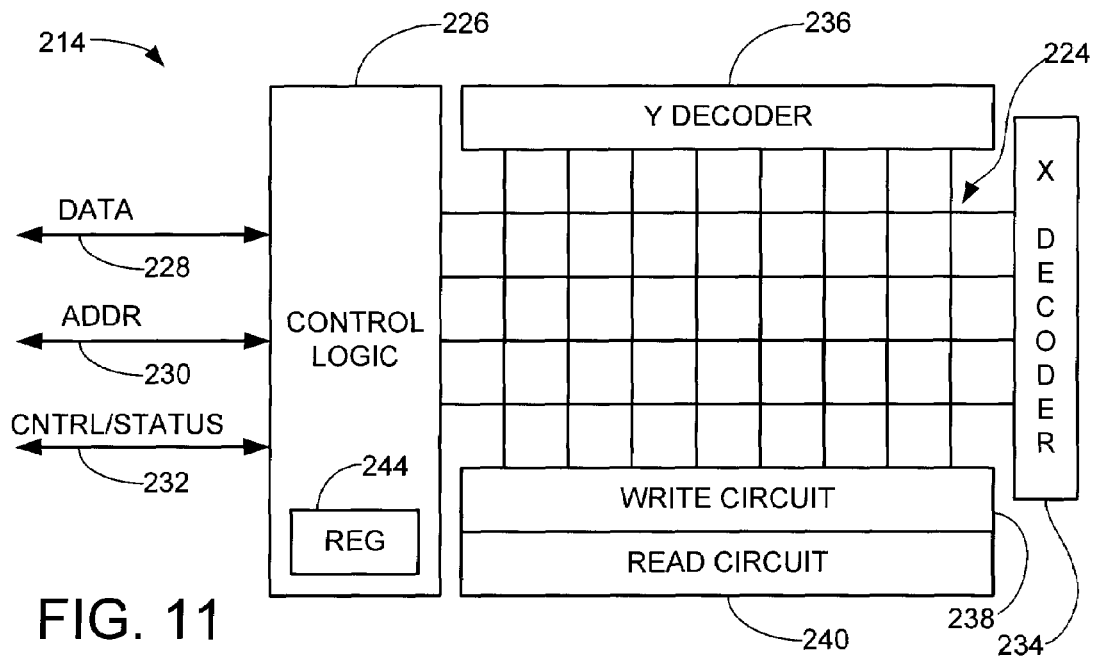
FIG. 11 shows circuitry used to read data from and write data to a memory array of the device of FIG. 10.

FIG. 11 provides a generalized representation of selected aspects of the memory space 214 of FIG. 10. Individual memory cells are denoted at 224 and arranged into rows and columns for access by suitable row (word) and column (bit) lines, etc. The actual configurations of the cells and the access lines thereto will depend on the requirements of a given application; for example, the dual path construction 160 of FIG. 8 may utilize separate write and read lines. Generally, however, it will be appreciated that the various control lines will generally include enable lines that selectively enable and disable the respective writing and reading of the value(s) of the individual cells.

Control logic 226 receives and transfers data, addressing information and 30 control/status values along multi-line bus paths 228, 230 and 232, respectively. X and Y decoding circuitry 234, 236 provide appropriate switching and other functions to access the appropriate cells 224.

A write circuit 238 represents circuitry elements that operate to carry out write operations to write data to the cells 224 (via programming of the associated PC1 layers), and a read circuit 240 correspondingly operates to obtain readback data from the cells 224 (by sensing the programmed resistance of the associated PC1 layers). Local buffering of transferred data and other values can be provided via one or more local registers 244. The circuitry of FIG. 11 is merely exemplary in nature, and any number of alternative configurations can readily be employed as desired depending on the requirements of a given application.

Figure 12:
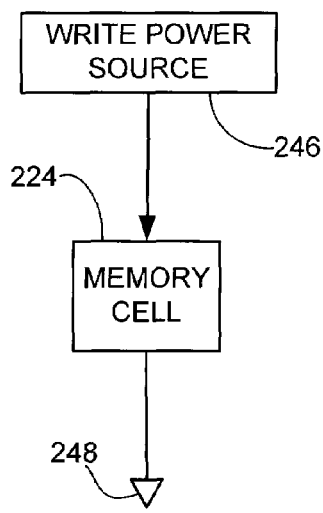
FIG. 12 generally illustrates a manner in which data are written to a memory cell of the memory array.

A write operation is carried out using circuitry as set forth by FIG. 12. A suitable write power source 246 applies a selected voltage pulse (e.g., 116 or 124 in FIG. 2) to program the resistance of an associated cell 224. More specifically, once the desired state of the cell 224 is identified, the write power source 246 generates a tailored voltage pulse. This tailored voltage pulse is routed to the cell and applied to an input electrode of the cell. Current passes through the cell to the opposing, output electrode, and the respective PC1 and PC2 layers react accordingly as discussed above to place the cell 224 in the final desired resistive state.

Figure 13:
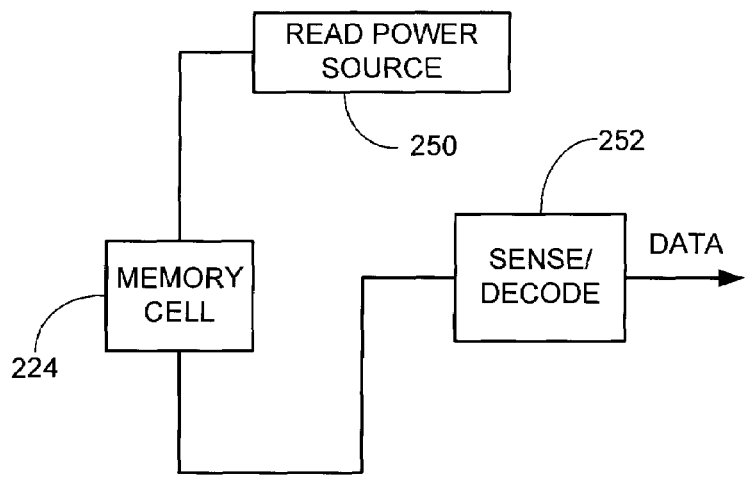
FIG. 13 generally illustrates a manner in which data are read from the memory cell of FIG. 3.

A read operation is carried out using circuitry as set forth by FIG. 13. A suitable read power source 250 applies a suitable read voltage to an associated cell 224, and a sense/decode circuit 252 senses the resistance level of the PC1 layer. More specifically, as discussed above the read voltage causes current to flow from an input electrode, through the cell and to an output electrode. A voltage drop is generated across the device in relation to the magnitude of this read current and the respective states of the PC1 and PC2 layers. This voltage drop is sensed, such as by the use of a sense amplifier in the circuit 252. In some embodiments, a reference voltage (not shown) is generated and the cell voltage is compared to this reference voltage.

If a single bit is stored by each cell 224, the sense/decode circuit 252 can comprise a sense amplifier (comparator) which compares a voltage drop across the cell to the reference voltage to discern the high or low resistance state of the cell. If two or more bits are stored by the cell, more complex sensing of the cell, including application of different controlled reference voltages, may be carried out as discussed above in FIGS. 6-7 and 9.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:
1. A semiconductor device comprising
a first phase change layer selectively configurable in a relatively low resistance crystalline phase and a relatively high resistance amorphous phase,
a first electrode layer coupled to the first phase change layer,
a second phase change layer thermally coupled to the first phase change layer wherein the second phase change layer is characterized as a metal-insulator transition material, a second electrode layer coupled to the second phase change layer, a third electrode layer connected to the first phase change layer in parallel with the first electrode layer, and a fourth electrode layer connected to the second phase change layer in parallel with the second electrode layer.

2. The semiconductor device of claim 1, characterized as a programmable rectifier in relation to the phase of the first phase change layer.

3. The semiconductor device of claim 1, characterized as a non-volatile memory cell in a semiconductor data storage array.

4. The semiconductor device of claim 3, wherein the device is configured to store a single bit in relation to whether the first phase change layer is placed in the crystalline phase or the amorphous phase.

5. The semiconductor device of claim 3, wherein the device is configured to concurrently store at least two bits in relation to a resistance of the first phase change layer and a transition voltage at which the second phase change layer transitions from an insulator to a metal.

6. The semiconductor device of claim 1, wherein the first phase change layer comprises a chalcogenide of group VI of the periodic table.

7. The semiconductor device of claim 1, wherein the first phase change layer comprises $Ge_2Sb_2Te_5$ (GST).

8. The semiconductor device of claim 1, wherein the first phase change layer comprises In—Ge—Te.

9. The semiconductor device of claim 1, wherein the second phase change layer comprises vanadium dioxide ($VO_2$).

10. The semiconductor device of claim 1, wherein the first phase change layer is programmed by applying a voltage pulse to the device through the first and second phase change layers sufficient to cause a temperature of the first phase change layer to exceed a melting temperature thereof, followed by a quench process whereby the temperature of the first phase change layer is reduced at a relatively fast rate, thereby providing the first phase change layer with a relatively high resistance.

11. The semiconductor device of claim 1, wherein the first phase change layer is programmed by applying a voltage pulse to the device through the first and second phase change layers which causes a temperature of the first phase change layer to not exceed a melting temperature thereof while exceeding a lower glass transition temperature thereof, followed by a set process whereby at least a portion of the first phase change layer crystallizes to provide a selected low resistance, wherein the second phase change layer transitions from an insulative phase to a metal phase during application of said voltage pulse, and wherein the selected low resistance of the first phase change layer is established in relation to said transition of the second phase change layer.

12. The semiconductor device of claim 1, wherein the semiconductor device further comprises an intermediate layer disposed between the respective first and second phase change layers which facilitates thermal transfer from the second phase change layer to the first phase change layer to adjust a voltage at which the second phase change layer transitions from an insulative state to a conductive metal state.

13. The semiconductor device of claim 1, wherein the first electrode layer has a first width less than a second width of the first phase change layer to provide a reduced areal contact area of the first electrode layer with respect to the first phase change layer, thereby increasing current density as current is passed from the first electrode layer to the first phase change layer.

14. The semiconductor device of claim 1, wherein the resistance of the first phase change layer is programmed via a first path through the device between the first electrode layer and the second electrode layer, and wherein the resistance of the first phase change layer is subsequently sensed via a second path through the device between the third electrode layer and the fourth electrode layer.

15. A method comprising:

providing a semiconductor device comprising a first phase change layer selectively configurable in a relatively low resistance crystalline phase and a relatively high resistance amorphous phase, a second phase change layer thermally coupled to the first phase change layer wherein the second phase change layer is characterized as a metal-insulator transition material, first and third electrode layers connected in parallel to the first phase change layer, and second and fourth electrode layers connected in parallel to the second phase change layer, and applying a programming pulse to the semiconductor device from the first electrode layer to the second electrode layer to provide the first phase change layer with a selected resistance.

16. The method of claim 15, wherein the selected resistance of the first phase change layer is established during the applying step in relation to a transition voltage at which the second phase change layer transitions from an insulator to a metal.

17. The method of claim 15, wherein the applying step comprises storing at least one non-volatile data bit in the device responsive to the selected resistance of the first phase change layer, and wherein the method further comprises subsequently reading the at least one non-volatile data bit from the device in relation to a sensed resistance of the device.

18. The method of claim 15, wherein the first phase change layer comprises $Ge_2Sb_2Te_5$ (GST) and the second phase change layer comprises vanadium dioxide ($VO_2$).

19. The method of claim 15, wherein the first phase change layer is programmed during the applying step by applying a voltage pulse to the device through the first and second phase change layers which causes a temperature of the first phase change layer to not exceed a melting temperature thereof while exceeding a lower glass transition temperature thereof, followed by a set process whereby at least a portion of the first phase change layer crystallizes to provide a selected low resistance, wherein the second phase change layer transitions from an insulative phase to a metal phase during application of said voltage pulse, and wherein the selected low resistance of the first phase change layer is established in relation to said transition of the second phase change layer.

* * * * *